(12) United States Patent
Lee et al.

(10) Patent No.: US 12,100,602 B2
(45) Date of Patent: Sep. 24, 2024

(54) WET ETCHING APPARATUS

(71) Applicant: SAMSUNG ELECTRONICS CO., LTD., Suwon-si (KR)

(72) Inventors: Jin Woo Lee, Yongin-si (KR); Yong Jun Choi, Gwacheon-si (KR); Seok Hoon Kim, Seongnam-si (KR); Seung Min Shin, Daejeon (KR); Ji Hoon Cha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 278 days.

(21) Appl. No.: 17/807,374

(22) Filed: Jun. 16, 2022

(65) Prior Publication Data
US 2022/0319878 A1 Oct. 6, 2022

Related U.S. Application Data

(63) Continuation of application No. 16/376,749, filed on Apr. 5, 2019, now abandoned.

(30) Foreign Application Priority Data
Sep. 4, 2018 (KR) .......... 10-2018-0105518

(51) Int. Cl.
H01L 21/67 (2006.01)
(52) U.S. Cl.
CPC .. *H01L 21/67086* (2013.01); *H01L 21/67115* (2013.01); *H01L 21/67253* (2013.01)
(58) Field of Classification Search
None
See application file for complete search history.

(56) References Cited

U.S. PATENT DOCUMENTS

| 5,057,184 A | 10/1991 | Gupta et al. |
| 5,292,373 A | 3/1994 | Arita et al. |
| 5,474,616 A | 12/1995 | Hayami et al. |
| 6,001,215 A | 12/1999 | Ban |
| 6,009,888 A | 1/2000 | Ye et al. |
| 6,058,950 A | 5/2000 | Fujii et al. |
| 6,398,904 B1 | 6/2002 | Heo et al. |
| 6,531,681 B1 | 3/2003 | Markle et al. |
| 6,720,522 B2 | 4/2004 | Ikegami et al. |

(Continued)

FOREIGN PATENT DOCUMENTS

| JP | 2005-79212 | 3/2005 |
| JP | 2014-165248 | 9/2014 |

(Continued)

OTHER PUBLICATIONS

Office Action issued in corresponding CN Application No. 201910831544.5 dated May 11, 2024.

*Primary Examiner* — Roberts P Culbert
(74) *Attorney, Agent, or Firm* — F. Chau & Associates, LLC

(57) ABSTRACT

A wet etching apparatus includes a process bath having an internal space configured to receive an etchant and having a support unit, on which a wafer is disposed to be in contact with the etchant. A laser unit is disposed above the process bath and is configured to direct a laser beam to the wafer and to heat the wafer thereby. An etchant supply unit is configured to supply the etchant to the internal space of the process bath.

11 Claims, 13 Drawing Sheets

(56) References Cited

U.S. PATENT DOCUMENTS

| | | |
|---|---|---|
| 6,849,865 B1 | 2/2005 | Nakamoto et al. |
| 2004/0173236 A1 | 9/2004 | Park et al. |
| 2005/0067101 A1 | 3/2005 | Funabashi |
| 2006/0096622 A1 | 5/2006 | Lee et al. |
| 2008/0132045 A1 | 6/2008 | Yoo |
| 2008/0206999 A1 | 8/2008 | Imada et al. |
| 2009/0114619 A1 | 5/2009 | Sotoaka et al. |
| 2012/0118322 A1 | 5/2012 | Sakaguchi et al. |
| 2014/0190936 A1* | 7/2014 | Yoo .................. H01L 21/6708 156/345.18 |
| 2019/0115224 A1 | 4/2019 | Lee et al. |
| 2019/0198344 A1 | 6/2019 | Murakami et al. |

FOREIGN PATENT DOCUMENTS

| | | |
|---|---|---|
| KR | 10-0924863 | 10/2009 |
| KR | 10-0956350 | 4/2010 |
| KR | 10-2018-0041433 | 4/2018 |

\* cited by examiner

WET ETCHING APPARATUS

CROSS-REFERENCE TO RELATED APPLICATION(S)

This application is a Continuation of co-pending U.S. patent application Ser. No. 16/376,749, filed on Apr. 5, 2019, which claims benefit of and priority to Korean Patent Application No. 10-2018-0105518, filed on Sep. 4, 2018 in the Korean Intellectual Property Office, the disclosures of which are herein incorporated by reference in their entirety.

TECHNICAL FIELD

The present disclosure relates to etching and, more specifically, to a wet etching apparatus.

DISCUSSION OF THE RELATED ART

In a semiconductor device manufacturing process, a wet etching process, in which an etchant is generally used, may be performed to selectively remove a portion of a film, thereby either leaving a desired pattern un-etched or etching only a desired pattern. To perform a smooth etching process, a high temperature may be maintained during the etching. For example, in the case of etching a nitride, a high temperature of 160° C. or more may be maintained.

During high-temperature etching, the etchant may be heated to the desired temperature. However, it may be difficult to heat the etchant to a sufficiently high process temperature due to a boiling point of the etchant or a limitation of heat resistance of other devices, and there may arise a problem in which an etching rate is uneven due to a flow rate of the etchant, unevenness of the temperature, or the like, depending on an area of the wafer being etched, such as whether it is the center of the wafer or the edge of the wafer that is being etched.

SUMMARY

A wet etching apparatus includes a process bath having an internal space configured to receive an etchant and having a support unit, on which a wafer is disposed to be in contact with the etchant. A laser unit is disposed above the process bath and is configured to direct a laser beam to the wafer and to heat the wafer thereby. An etchant supply unit is configured to supply the etchant to the internal space of the process bath.

A wet etching apparatus includes a process bath having an internal space configured to receive an etchant and having a support unit disposed therein. The support unit is configured to support a wafer that is in contact with the etchant. A laser unit is disposed above the process bath and has a laser light source emitting a laser beam and an optical system expanding an area of the laser beam and configured to expose the wafer with the expanded laser beam. An etchant supply unit has an etchant injection unit and an etchant discharge unit respectively provided on sides opposite to the process bath. A pipe connects the etchant injection unit and the etchant discharge unit. A circulation pump is mounted on the pipe.

A wet etching apparatus includes a process bath having an internal space configured to receive an etchant and including an opening and recessed into the internal space. A supporting part is disposed around the opening and supports an outer peripheral portion of the wafer. The wafer is disposed on the supporting part in contact with the etchant. A laser unit is disposed above the process bath and casts a laser beam onto a surface opposite to the surface to be treated of the wafer such that the wafer is heated. An etchant supply unit is configured to supply the etchant to the internal space of the process bath. A discharge unit is configured to discharge the etchant from the internal space of the process.

BRIEF DESCRIPTION OF DRAWINGS

A more complete appreciation of the present disclosure and many of the attendant aspects thereof will be readily obtained as the same becomes better understood by reference to the following detailed description, taken in conjunction with the accompanying drawings, in which:

FIGS. 6A to 11A are plan views illustrating a method of manufacturing a semiconductor device using a wet etching apparatus according to exemplary embodiments of the present disclosure;

FIGS. 6B to 11B are cross-sectional views taken along the line I-I' of FIGS. 6A to 11A, respectively.

DETAILED DESCRIPTION

Figure 1:
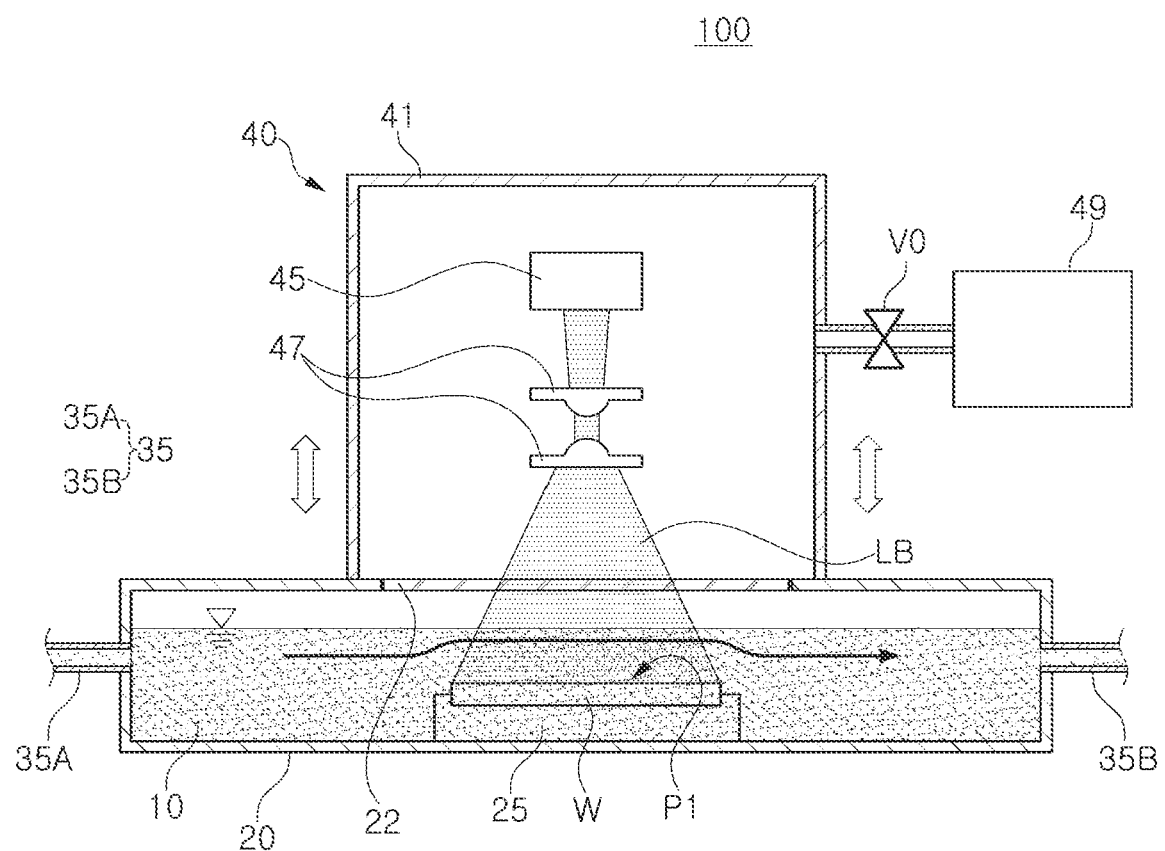
FIG. 1 is a schematic cross-sectional view illustrating a wet etching apparatus according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

FIG. 1 is a schematic cross-sectional view illustrating a wet etching apparatus according to an exemplary embodiment of the present disclosure.

Referring to FIG. 1, a wet etching apparatus 100 according to an exemplary embodiment of the present disclosure includes a process bath 20 having an internal space 20S (see, FIG. 2) in which an etchant 10 may be received, a laser unit 40 disposed above the process bath 20, and an etchant connection unit 35 supplying the etchant 10 to the internal space 20S of the process bath 20. The laser unit 40 may be a device configured to provide a laser beam.

The process bath 20 includes a support unit 25 on which the wafer W is disposed so as to be in contact with the etchant 10. The support unit 25, as illustrated in FIG. 1, is located in the internal space 20S of the process bath 20, and may be configured such that the wafer disposed thereon is immersed in the etchant 10. The wafer W may be situated such that a surface to be treated (e.g. etched) P1 faces upward.

In such an arrangement, a laser beam LB emitted from the laser unit 40 may be cast onto the surface to be treated P1 of the wafer.

As described above, the laser beam LB may be directly cast onto the surface to be treated P1 while it is in contact with the etchant 10. Therefore, a portion to be etched by the etchant is exposed.

The process bath 20 may include a transparent window 22 for casting the laser beam LB to the wafer W disposed on the support unit 25. Further, the transparent window 22 may be hingedly connected to the process bath 20 to open and close the internal space 20S of the process bath 20. The transparent window 22 may be opened to place the wafer W on the support unit 25. In the process of placing the wafer W, the laser unit 40 may be detached from the process bath 20. The process bath 20 may alternatively have a separate inlet instead of the transparent window W.

The laser unit 40 is disposed above the process bath 20 and is configured to cast the laser beam LB onto the surface to be treated P1 of the wafer W. A proper process temperature is used for a smooth etching. In this exemplary embodiment, the laser beam LB may be used as a means for heating the wafer W to obtain a desired high process temperature.

In some approaches the etchant 10 may be used as a heating means, but this approach may be limited in how hot the process temperature may be, and thermal deformation and/or damage may occur depending on heat resistance of other devices such as the process bath 20, or the like.

To solve such a problem, in exemplary embodiment of the present disclosure, the laser beam is directly cast to the wafer W to be treated, using the laser unit 40, to heat the wafer W to the desired process temperature.

Figure 10A:
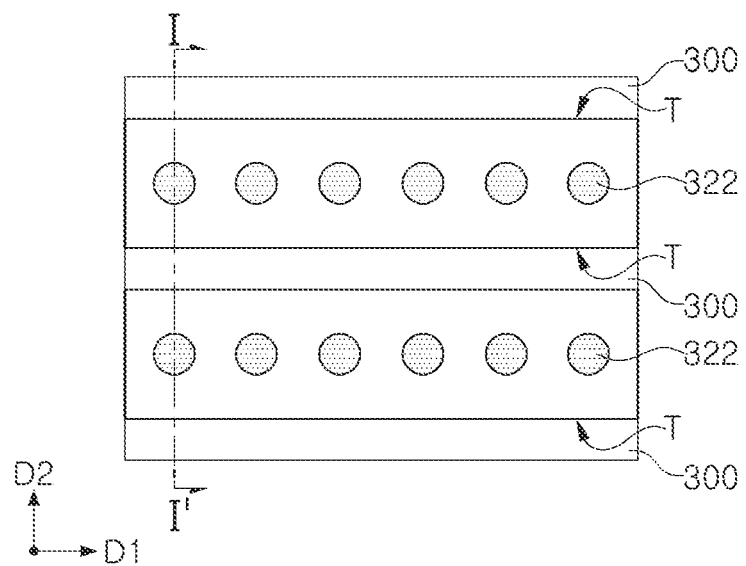
Figure 10B:
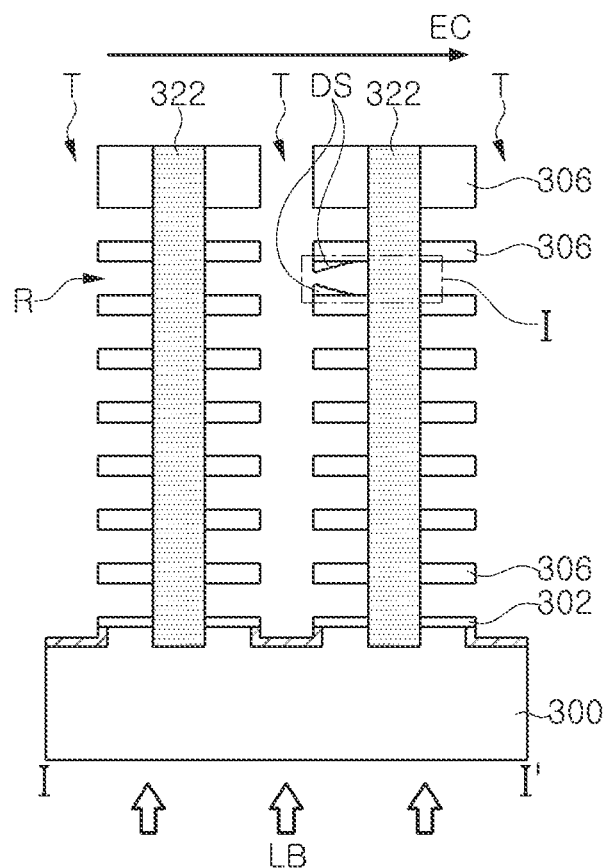

In some exemplary embodiments of the present disclosure, the wafer W may include a stacked nitride film (for example, a silicon nitride film) and an oxide film (for example, a silicon oxide film), and the wet etching process may be introduced to selectively etch the nitride film on the wafer W (referring to FIGS. 10A and 10B). In this case, the etchant 10 for etching the nitride film may have etching selectivity with respect to the oxide film. For example, the etching rate of the oxide film by the etchant 10 may be smaller than the etching rate of the nitride film by the etchant 10.

For example, for etching a nitride, phosphoric acid may be used as the etchant 10, and the etching process temperature is set to be a high temperature of 160° C. or more (for example, 163° C.). However, since the desired etching process temperature is higher than a boiling point of phosphoric acid (for example, 158° C.), there is a problem in achieving the desired etching processing temperature by directly heating (e.g. boiling) the etchant 10.

As described above, instead of heating the etchant 10, the wafer W may be heated so as to be raised to the desired process temperature, by using the laser unit 40 disposed above the process bath 20. In some exemplary embodiments of the present disclosure, the laser unit 40 may be used along with the heating method of the etchant 10 (even though the etchant 10 is heated to a temperature lower than the desired etching process temperature).

The laser unit 40 includes a laser light source 45 emitting the laser beam LB and an optical system 47 disposed between the laser light source 45 and the process bath 20. The optical system 47 is configured to expand an area of the laser beam LB.

The laser light source 45 may be configured to emit the laser beam LB having a wavelength within a range of 10 nm to 1 mm, or more preferably from 200 nm to 900 nm, which may span from ultraviolet to infrared light. The wavelength of the laser beam LB may be appropriately selected depending on a substance to be etched and used. Further, the laser power condition may be appropriately selected according to a heating temperature.

The optical system 47 may include an arrangement of a plurality of lenses configured for expanding an area of a laser beam LB generated from the laser light source 45. For example, an arrangement of the plurality of lenses may be an arrangement of various lenses such as a concave lens and/or a convex lens, and the like. The area of the laser beam LB expanded by the optical system 47 may have an area capable of substantially covering the surface to be treated P1 of the wafer W.

The laser unit 40 may include a housing 41 sealing the laser light source 45 and the optical system 47. The sealed space of the housing 41 may be connected to a vacuum pump 49. By operating a valve VO associated with the vacuum pump 49, the sealed space of the housing 41 may be depressurized or maintained in a near-vacuum. Through the depressurization/vacuum operation, the laser light may be prevented from being partially blocked or otherwise interfered with by dust, fume, or the like that may be generated in the etching process.

The wet etching apparatus 100 may include an etchant connection unit 35 supplying the etchant 10 to an internal space 20S of the process bath 20. The etchant connection unit 35 may be configured to allow the etchant 10 to flow into the internal space 20S of the process bath 20 at a speed that is within a predetermined range. For example, the etchant connection unit 35 may supply the etchant at a flow rate in a range of 0.1 to 1 m/sec.

The etchant connection unit 35 may include an etchant injection unit 35A disposed on a first side of the process bath 20 and injecting the etchant 10 into the internal space 20S, and an etchant discharge unit 35B disposed on a second side of the process bath 20 and discharging the etchant 10 from the internal space 20S. The first side and the second side of the process bath 20 may be disposed to face each other.

In addition, since the etchant injection unit 35A and the etchant discharge unit 35B each have a plurality of connectors arranged along respective opposite side surfaces, a flow rate of the etchant 10 may be maintained relatively uniformly within an entire area of the internal space 20A.

The process bath 20 may have a volume that is sufficient for submerging the wafer W therein and a structure having a height smaller than the width. The process bath may have a relatively small internal space 20S such that only a sufficient amount of etchant 10 for etching one wafer may be received.

For example, when using a 300 mm diameter wafer, the process bath 20 may have an internal space 20S having a somewhat larger area (for example, 310 mm×310 mm). Further, the volume of the internal space 20S may be in the range of 1 to 10 liters.

Figure 2:
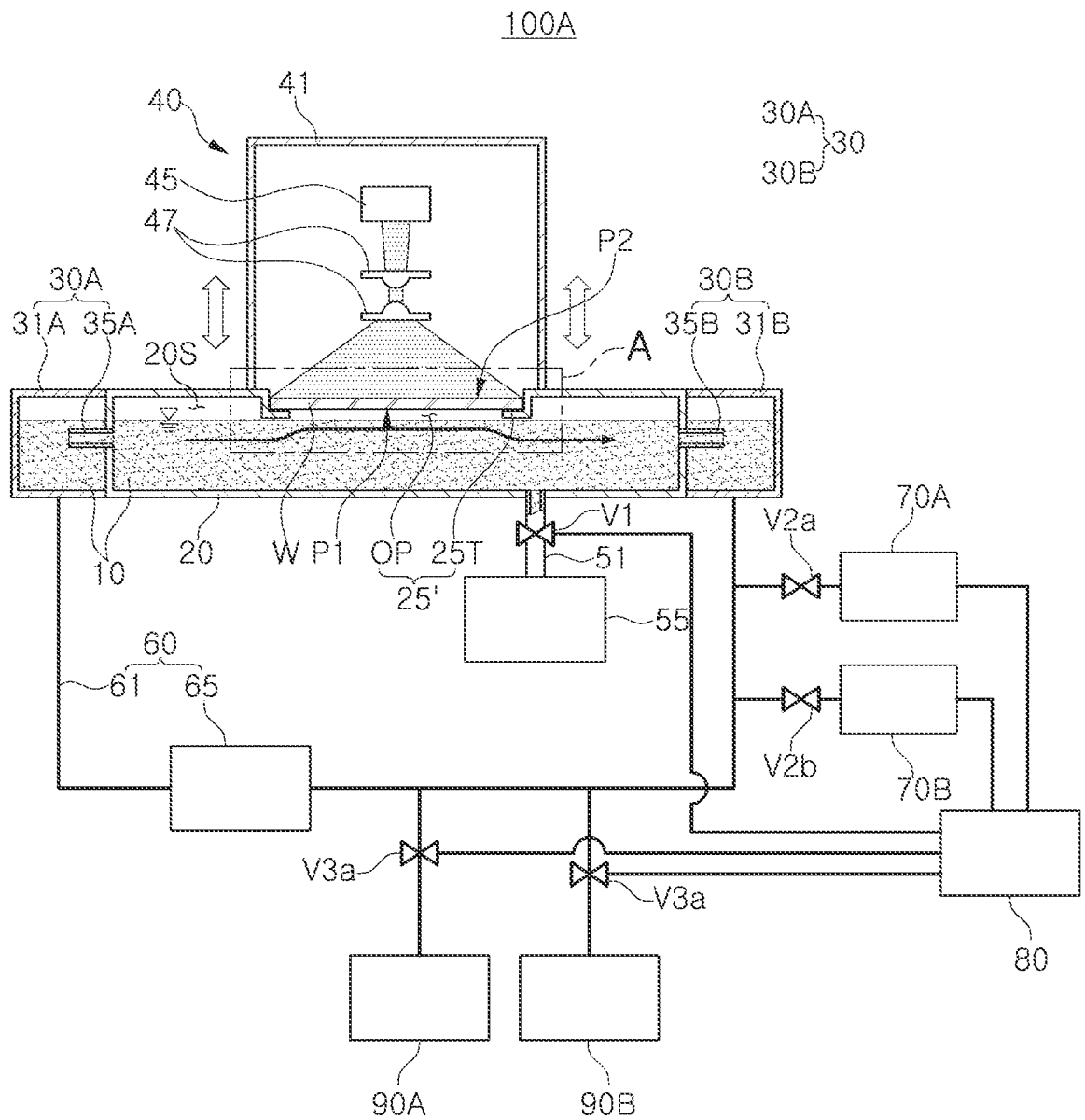
FIG. 2 is a schematic cross-sectional view illustrating a wet etching apparatus according to an exemplary embodiment of the present disclosure.
Figure 3:
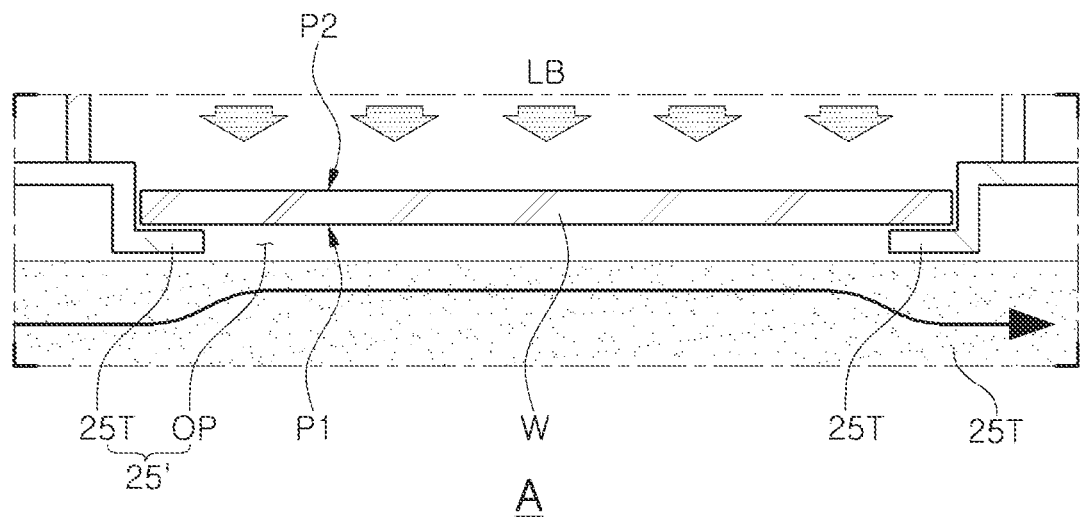
FIG. 3 is an enlarged cross-sectional view illustrating a wafer support unit ("A" portion) in the wet etching apparatus of FIG. 1.
Figure 4:
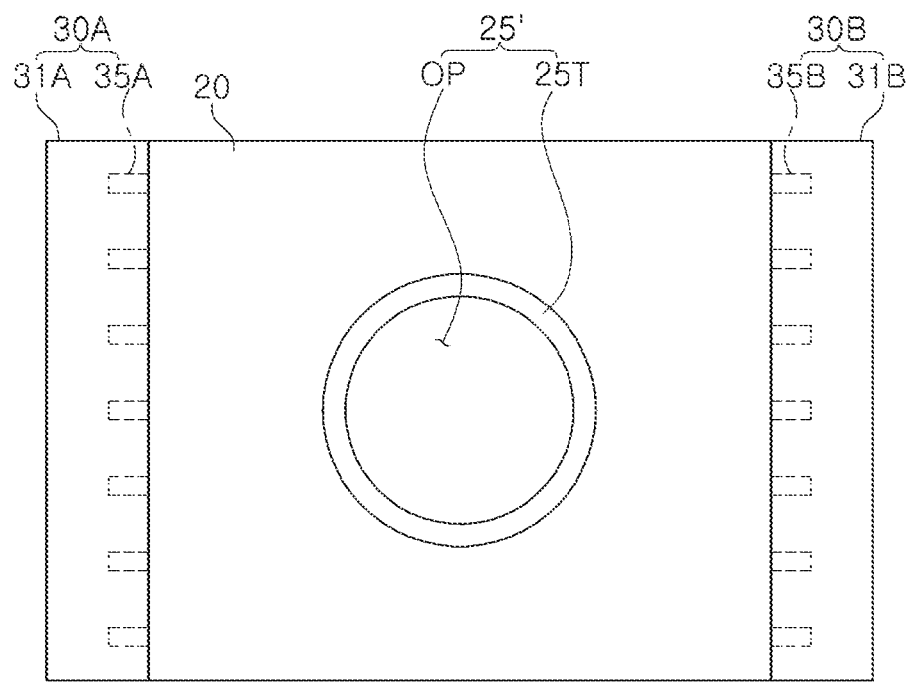
FIG. 4 is a plan view illustrating the wafer support unit ("A" portion) in the wet etching apparatus of FIG. 1.

FIG. 2 is a schematic cross-sectional view of a wet etching apparatus in accordance with exemplary embodiments of the present disclosure, and FIGS. 3 and 4 are an enlarged cross-sectional view and a plan view, respectively, illustrating a wafer support unit ("A" portion) in the wet etching apparatus of FIG. 1.

Referring to FIG. 2, a wet etching apparatus 100A may be a structure similar to the exemplary embodiment illustrated in FIG. 1, except that the structure of a support unit 25' is different and the etchant system 30 further includes an etchant circulation system and a concentration detecting system. Therefore, the description illustrated in FIG. 1 may be combined with the description regarding this exemplary embodiment, unless otherwise specifically stated.

The support unit 25' may include an opening OP located at an upper portion of the process bath 20 and recessed in the internal space 20S and a supporting part 25T located around the opening OP and in which an outer peripheral portion of the wafer W is disposed.

As illustrated in FIG. 3, the wafer W may be disposed such that a surface to be treated P1 is directed to the internal space 20S at the supporting part 25T. A surface P2 located opposite to the surface P1 to be treated of the wafer W is oriented directed upward by such a disposition of the wafer W, and the laser beam LB may irradiate the surface P2 located on the opposite side.

In the case of the disposition of such a wafer W, the laser beam LB is cast onto the surface P2 opposite to the surface to be treated P1, which is etched in contact with the etchant 10. Particularly, when a portion to be etched by the etchant 10 is not exposed externally, but is located inside a considerable depth (for example, a three-dimensional semiconductor element such as V-NAND, referring to FIGS. 6 to 10), it is possible to ensure uniform heating in the thickness direction by irradiating and heating the opposite surface.

In addition, as illustrated in FIG. 4, the recessed opening OP may be formed corresponding to the shape and size of the wafer W, such that the supporting part 25T of the opening OP is located at the outer peripheral portion of the wafer W.

A separate input window covering the opening OP of the process bath 20 may be provided, but, as in this exemplary embodiment of the present disclosure, it may be configured to cover the opening OP by the wafer W to be etched without a separate input window. The outer peripheral portion of the wafer W may be brought into close contact with the supporting part 25T such that the wafer W may be closed by the opening OP and substantially seal the internal space 20S of the process bath 20, while the surface to be treated P1 of the wafer W is in contact with the etchant 10. The outer peripheral portion of the wafer W may be brought into close contact with the supporting part 25T by an etchant having a predetermined viscosity such that the wafer W may close the opening OP so as to substantially seal the internal space 20S of the process bath 20, while the surface to be treated P1 of the wafer W is in contact with the etchant 10.

The etchant system 30 may further include an etchant circulation unit 60 connected to the etchant supply system 30A and the etchant discharge system 30B to circulate the etchant 10, together with an etchant injection unit 35A and an etchant discharge unit 35B.

The etchant circulation unit 60 may include a pipe 61 connecting the etchant supply system 30A and the etchant discharge system 30B and a circulation pump 65 mounted on the pipe 61. The etchant 10 flowing at a constant speed into the internal space 20S of the process bath 20 may be circulated and supplied by the operation of the circulation pump 65.

The etchant supply system 30A and the etchant discharge system 30B may include first and second sub-baths 31A and 31B capable of temporarily accommodating the etchant 10 therein together with an injection unit 35A and a discharge unit 35B, which include connectors connected to the internal space 20S of the process bath 20.

Thus, the etchant circulation unit 60 may maintain the flow rate of the etchant 10 to ensure a uniform and smooth etching. As the number of circulation cycles of the etchant increases in the process of etching, the characteristics of the etchant 10 may be changed (e.g. may become contaminated), resulting in degradation of etching performance or failure. To prevent this, the wet etching apparatus 100A may include concentration detecting units 70A and 70B to detect at least one of the characteristics of the etchant 10. For example, the concentration of the etchant 10 and the concentration of the element to be etched.

The wet etching apparatus 100A may include a first concentration detecting unit 70A detecting the concentration of the element to be etched and a second concentration detecting unit 70B detecting the concentration of the etchant 10. A constant amount of the etchant 10 may be sampled at a desired point by selectively operating first and second detection valves V2a and V2b to detect the concentration of the element to be etched and the concentration of the etchant 10.

The first concentration detecting unit 70A may be connected to the pipe 61 and may detect the concentration of the element to be etched discharged from the process bath 20. Similarly, the second concentration detecting unit 70B may be connected to the pipe 61 and may detect the concentration of the etchant 10 discharged from the process bath 20.

In this exemplary embodiment of the present disclosure, the etchant 10 may be detected from a portion of the pipe 61 adjacent to the etchant discharge unit 35B, but alternatively, the first and second concentration detecting units 70A and 70B may be directly connected to the etchant discharge unit 35B.

The wet etching apparatus 100A may be connected to the etchant circulation unit 60 and may further include an etchant storage unit 90A supplying a pure etchant according to the concentration of the detected element to be etched.

Similarly, the wet etching apparatus 100A may be connected to the etchant circulation unit 60 and may further include a deionized water storage unit 90B, supplying deionized (D.I.) water to the etchant, according to the concentration of the detected etchant 10.

When the concentration of the element to be etched detected by the first concentration detecting unit 70A exceeds a predetermined value, a process control unit 80 may discharge the etchant 10 through an etchant discharge unit 51 and may resupply the pure (e.g. uncontaminated) etchant to the process bath 20 from the etchant storage unit 90A.

The etchant discharge unit 51 may be configured to discharge the etchant 10 from the internal space 20S of the process bath 20 externally. The etchant discharge unit 51 may be connected to a discharge pump 55, and the process control unit 80 may control an exhaust valve V1 to discharge the etchant 10, already used, from the etchant discharge unit 51, by using the discharge pump 55. Next, the process control unit 80 may supply the new pure etchant through the pipe 61 from the etchant storage unit 90A by operating a first supply valve V3a.

Similarly, when the concentration of the etchant 10 detected by the second concentration detecting unit 70B exceeds a predetermined value, the process control unit 80 may control so as to resupply the deionized water to the etchant 10. The process control unit 80 may operate a second supply valve V3b to resupply an appropriate amount of deionized water from the deionized water storage unit 90B through the pipe 61.

In some exemplary embodiments of the present disclosure, the etchant may include phosphoric acid for etching silicon nitride, and the element to be etched may include silicon Si.

In this case, the etchant 10 may include silicon Si generated by the etching of the silicon nitride film, and the silicon concentration in the etchant 10 may be increased as the etching process proceeds. When the silicon concentration in the etchant 10 reaches a predetermined value (for example, a threshold value), an oxide may be grown on the surface of the silicon oxide film to increase the thickness of the silicon oxide film.

To suppress such an abnormal growth phenomenon, the concentration of the silicon in the etchant 10 is measured using the first concentration detecting unit 70A, and when the concentration of the element to be etched detected by the first concentration detecting unit 70A exceeds a predetermined value, the process control unit 80 may discharge the etchant 10 through the etchant discharge unit 51 and may resupply the pure etchant to the process bath 20 from the etchant storage unit 90A.

Similarly, since the etchant 10 is used in a heated state, moisture may be evaporated as the etching process proceeds, and the concentration of a phosphoric acid may gradually increase. When the concentration of the etchant 10 reaches a predetermined value (for example, a threshold value), the viscosity becomes excessively high such that the workability may be extremely degraded.

To solve such a problem, the concentration of the etchant 10 is measured using the second concentration detecting unit 70B, and when the concentration of the etchant 10 detected by the second concentration detecting unit 70B exceeds a predetermined value, the process control unit 80 may resupply the deionized water from the deionized water storage unit 90A to the pipe 61, thereby stabilizing the concentration of the etchant.

Figure 5:
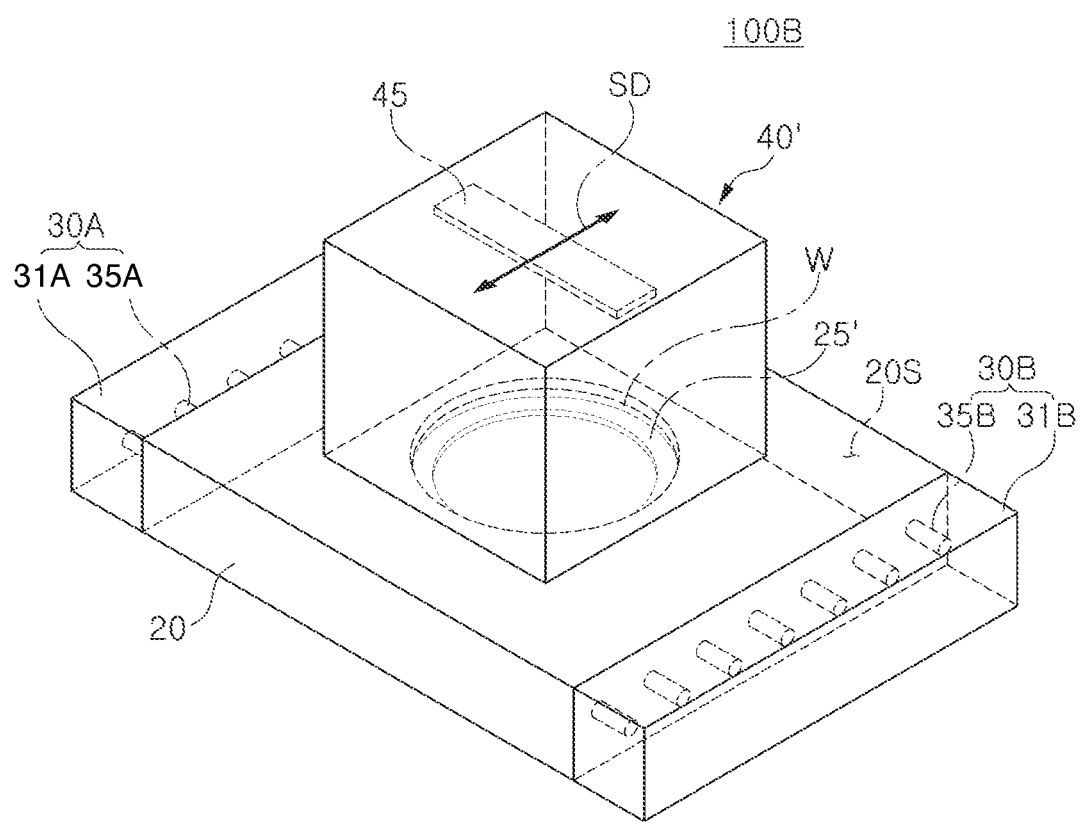
FIG. 5 is a schematic perspective view illustrating a wet etching apparatus according to an exemplary embodiment of the present disclosure.

FIG. 5 is a schematic perspective view illustrating a wet etching apparatus according to an exemplary embodiment of the present disclosure.

Referring to FIG. 5, a wet etching apparatus 100B may be understood as being a structure similar to the structure illustrated in FIG. 1 except that the laser unit 40' is implemented by a scanning method and only the structures of the support unit 25' and the etchant system 30. Therefore, the description of the exemplary embodiment illustrated in FIG. 1 may be combined with the description of this exemplary embodiment, unless otherwise specifically stated.

The laser unit 40' may include a laser light source 45' emitting a line-type laser beam and a scanning unit moving the laser beam such that the wafer W is irradiated thereby. A moving direction SD of the scanning unit may be a width direction of the line-type laser beam. For example, when using a wafer having a diameter of 300 mm, a length of the line-type laser beam may be at least 300 mm. Therefore, almost an entire area of the wafer W may be irradiated by scanning to ensure a relatively uniform heating.

In an exemplary embodiment of the present disclosure, the scanning unit may be configured to physically move the laser light source. In an exemplary embodiment of the present disclosure, the scanning unit may move the laser beam by fixing the laser light source and operating the optical system.

The laser unit 40' includes a housing 41 having a closed space in which a path of the laser beam is located, and the closed space may be depressurized or maintained in a vacuum state.

The support unit 25' and the etchant system 30 may have a similar structure to the support unit 25' and the etchant system 30 of the wet etching apparatus illustrated in FIG. 2. Particularly, in FIG. 5, the etchant circulation system and the concentration detecting system are not illustrated, but the wet etching system 100B may employ the etchant circulation system and the concentration detecting system.

The wet etching apparatus may be used in various semiconductor device manufacturing methods. Hereinafter, a manufacturing process of a three-dimensional semiconductor device such as a V-NAND (particularly, a silicon nitride removing process), and a manufacturing process of a logic device (particularly, a replacement process for a gate structure) will be described.

FIGS. 6A to 11A are plan views illustrating a method of manufacturing a semiconductor device (for example, a V-NAND) using a wet etching process according to exemplary embodiments of the present disclosure, and FIGS. 6B to 11B are cross-sectional views taken along the line I-I' of 6A to 11A, respectively.

Figure 6A:
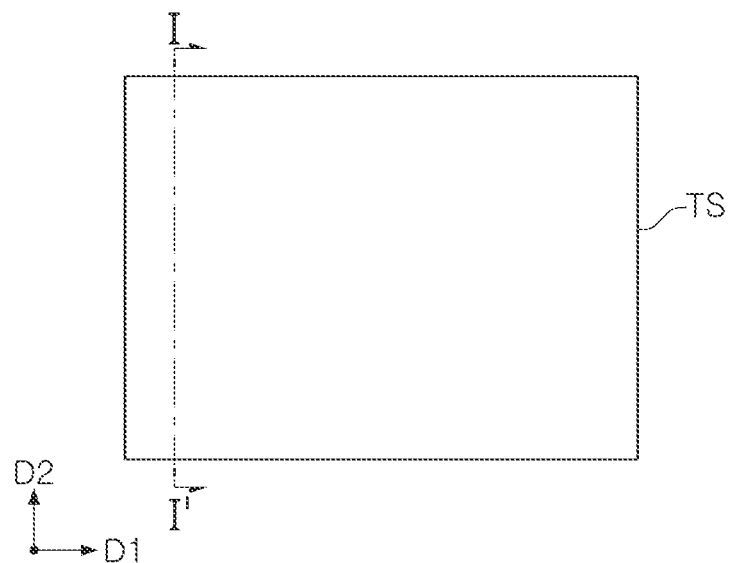
Figure 6B:
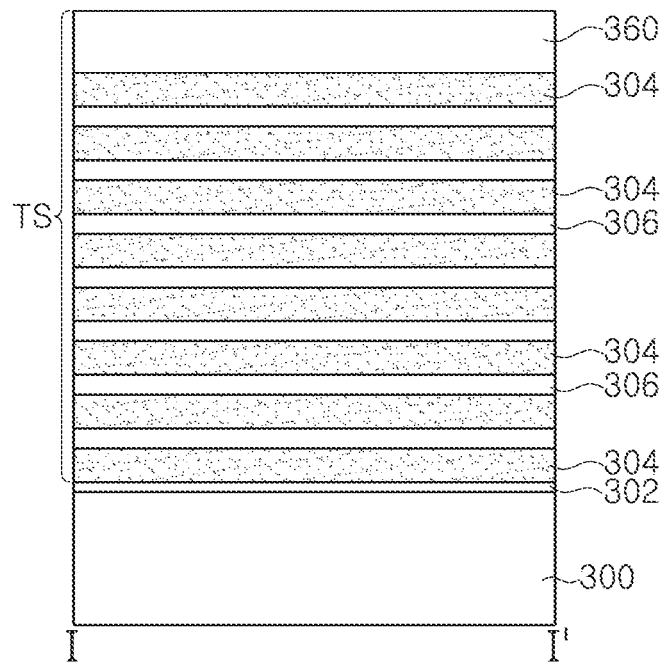

Referring to FIGS. 6A to 6B, a lower insulating film 302 may be formed on a substrate 300. For example, the substrate 300 may be a silicon substrate, a germanium substrate, or a silicon-germanium substrate. The lower insulating film 302 may be a silicon oxide film formed through a thermal oxidation process or a silicon oxide film formed using a deposition technique. A thin film structure TS may be formed by alternately and repeatedly depositing sacrificial films 304 and insulating films 306 of the lower insulating films 302.

In some exemplary embodiments of the present disclosure, the sacrificial films 304 may have the same thicknesses. In other exemplary embodiments of the present disclosure, the sacrificial films 304 of the bottom and top layers of the thin film structure TS may be formed to be thicker than the sacrificial films 304 located therebetween. The insulating films 306 may have the same thickness, or a part of the insulating films 306 may have different thicknesses. The lower insulating film 302 may have a thickness that is less than that of the sacrificial films 304 and the insulating films 306 formed thereon.

In some exemplary embodiments of the present disclosure, the sacrificial films 304 and the insulating films 306 may include materials having different etching selectivities. In this approach, the sacrificial films 304 may be formed of a silicon nitride film, and the insulating films 306 may be formed of a silicon oxide film.

Figure 7A:
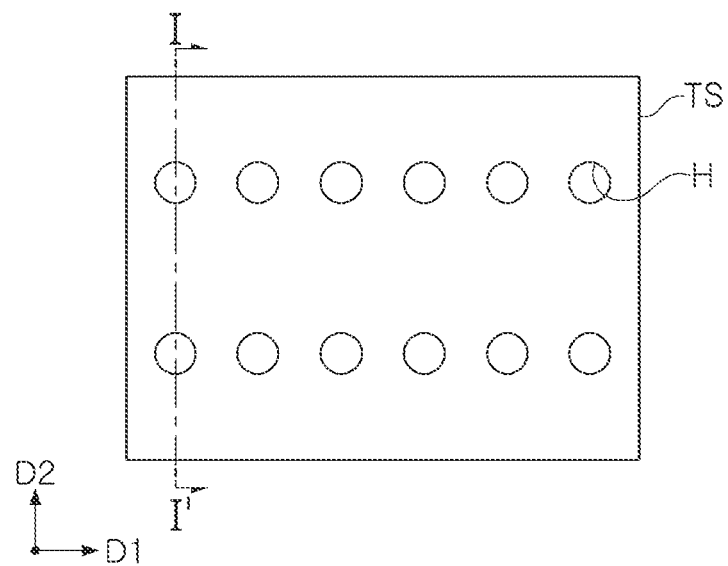
Figure 7B:
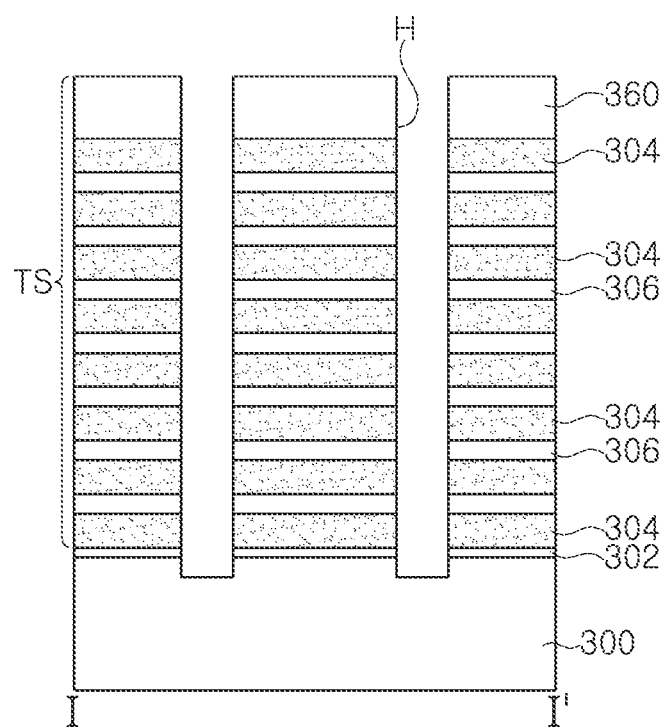

Referring to FIGS. 7A to 7B, a penetration hole H exposing the substrate 300 through the thin film structure TS may be formed. The penetration hole H may be formed in the thin film structures TS in plural, and the plurality of penetration holes H may be formed two-dimensionally on an upper surface of the thin film structure TS. According to some example embodiments, the penetration holes H may be arranged to form one row along a first direction D1. In other exemplary embodiments of the present disclosure, the penetration holes H may be arranged in a zigzag manner in the first direction D1.

The penetration hole H may be formed by forming a first mask pattern having an opening defining an area in which the penetration hole H is to be formed on the thin film structure TS, and may be formed by anisotropically etching the thin film structure TS using the first mask pattern as an etching mask. The first mask pattern may be formed of a material having etching selectivity with respect to the sacrificial films 304 and the insulating films 306. The upper surface of the substrate 300 is over-etched by the etching process, such that the upper portion of the substrate 300 may be recessed. Accordingly, the penetration hole H may penetrate at least a part of the substrate 300.

Figure 8A:
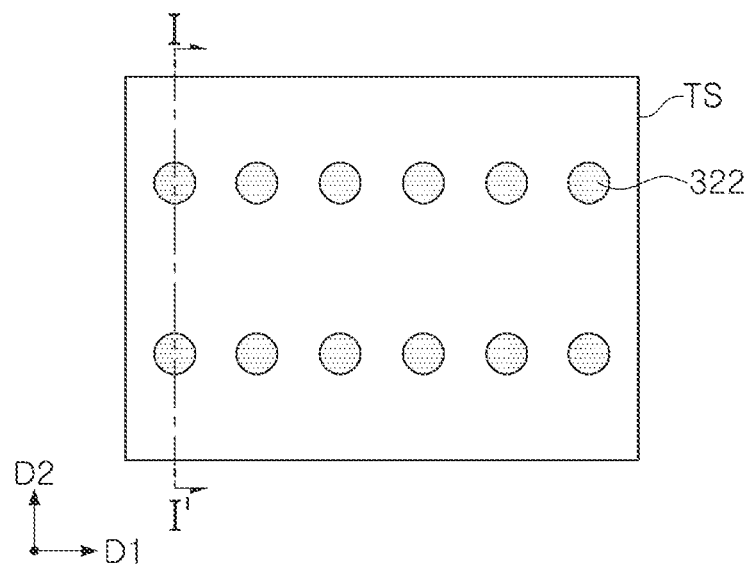
Figure 8B:
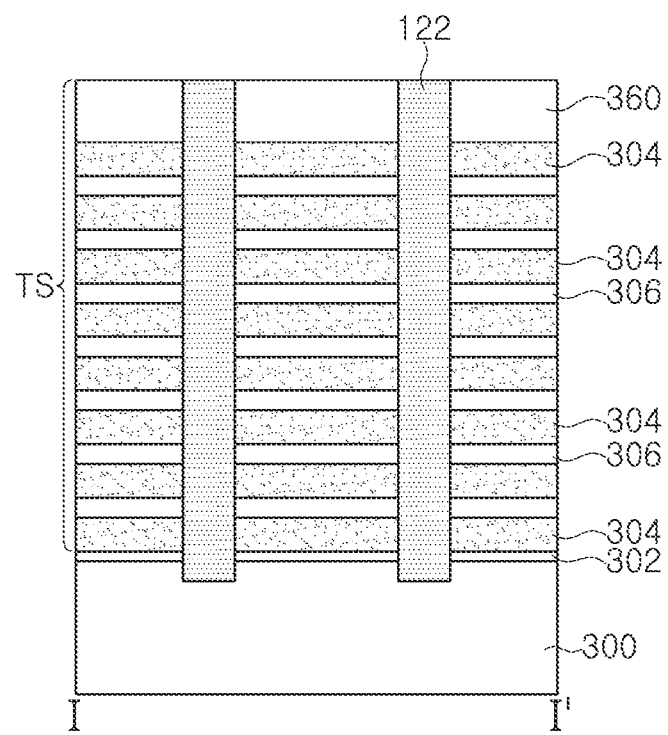

Referring to FIGS. 8A and 8B, a semiconductor pattern 322 may be formed in the penetration hole H. In some exemplary embodiments of the present disclosure, the semiconductor pattern 322 may be formed in a pillar shape penetrating through at least a part of the substrate 300. The semiconductor pattern 322 may be formed by forming a semiconductor film filling the penetration hole H on the thin film structure TS and then planarizing the semiconductor film until the upper surface of the thin film structure TS is exposed. The semiconductor film may include a semiconductor material formed by atomic layer deposition ALD or chemical vapor deposition CVD (for example, a polycrystalline silicon film, a monocrystalline silicon film, or an amorphous silicon film). The semiconductor pattern 322 may be locally formed in the penetration hole H by the planarization process.

Figure 9A:
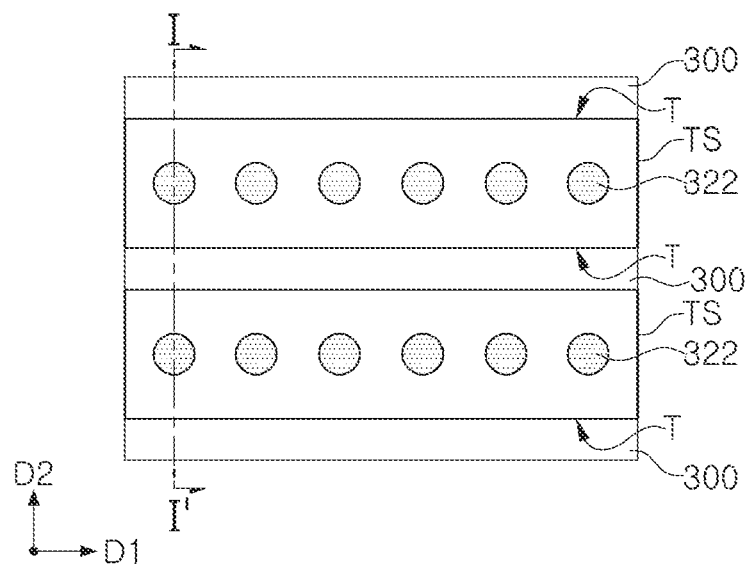
Figure 9B:
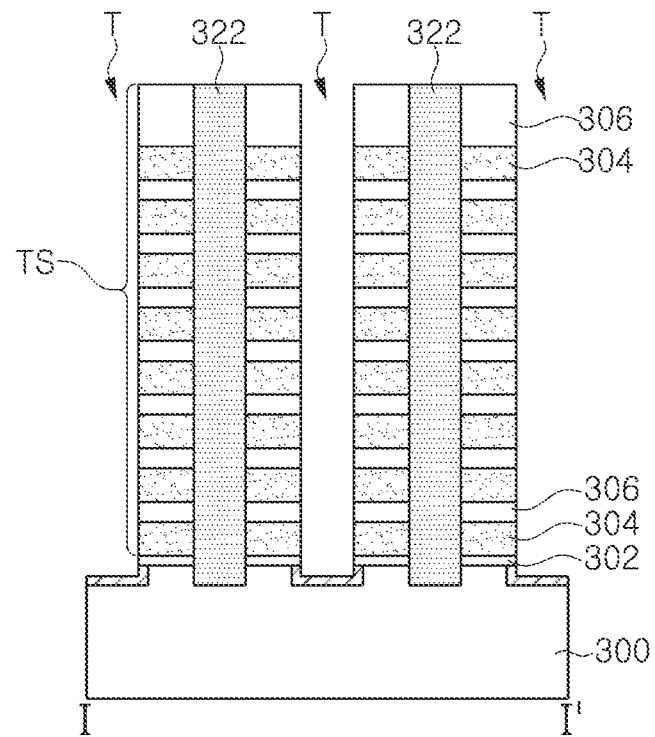

Referring to FIGS. 9A and 9B, the thin film structure TS may be patterned to form a trench T exposing the substrate 300 between adjacent semiconductor patterns 322. The trench T may be formed by forming a second mask pattern defining a planar position on which the trench T is to be formed on the thin film structure TS and then anisotropically etching the thin film structure TS using the second mask pattern as an etching mask. The trench T may be spaced apart from the semiconductor pattern 322 and may be formed to expose sidewalls of the sacrificial films 304 and the insulating films 306. During the etching process, the upper portion of the substrate 300 is over-etched, such that the upper portion of the substrate 300 may be recessed. As the trench T is formed, the thin film structure TS a may have a line shape extending in one direction (for example, the first direction D1). The thin film structure TS in the form of a single line shape may be penetrated by the plurality of semiconductor patterns 322.

Referring to FIGS. 10A and 10B, the sacrificial films 304 exposed by the trench T may be removed, such that recessed areas R may be formed between the insulating layers 306. The recessed areas R may be formed by isotropically etching the sacrificial films 304, using the etching conditions having the etching selectivity with respect to the insulating films 306, the semiconductor pattern 322, the lower insulating film 302, and the substrate 300. The sacrificial films 304 may be completely removed by the isotropic etching process. For example, when the sacrificial films 304 are silicon nitride films, and the insulating films 306 are silicon oxide films, the etching process may be a wet etching process using an etchant containing phosphoric acid.

As described above, in an etching process using the etchant containing the phosphoric acid, silicon Si is generated by the etching process of the sacrificial layers 304, the silicon concentration in the etchant may increase as the etching process proceeds. When the silicon concentration reaches a threshold value within the etchant, as indicated as "I," an abnormal growth oxide DS may be grown on the surface of the silicon oxide film, which may result in lower reliability and cause failure. However, according to this approach, as illustrated in FIG. 2, a first concentration detector 70A is used to measure the concentration of elements to be etched, and when the concentration of the elements to be etched detected from the first concentration detector 70A exceeds a predetermined value, a process control unit 80 may discharge the etchant through an etchant discharge unit 51, and resupply the pure phosphoric acid from the etchant storage unit 90A to the process bath 20 as an etchant, thereby preventing a failure caused by the abnormal growth oxide.

In some exemplary embodiments of the present disclosure, the present etching process may be performed by using the wet etching apparatus illustrated in FIGS. 1 to 5. For example, the wet etching apparatuses 100A and 100B illustrated in FIGS. 2 to 4 or 5 may be used. In the wet etching apparatuses 100A and 100B, the surface to be treated P1 may be directed to the internal space 20S by disposing the wafer W on the supporting part 25T. The surface to be treated P1 of the wafer may be exposed to the etchant flow ("EC" of FIG. 10B). A surface P2 located opposite to the surface to be treated P1 of the wafer W is directed upward, and the laser beam LB may irradiate the surface P2 located on the opposite side. Thus, by reversely configuring the surface to which the laser beam LB is applied and the surface to which the etchant flow EC is brought in contact, it may be used in the etching process. For example, referring to FIG. 10B, since a portion to be etched is not exposed externally, but is located inside with a considerable depth, it is possible to ensure a uniform etching rate in the thickness direction D2 of the device by irradiating and heating the opposite surface.

Figure 11A:
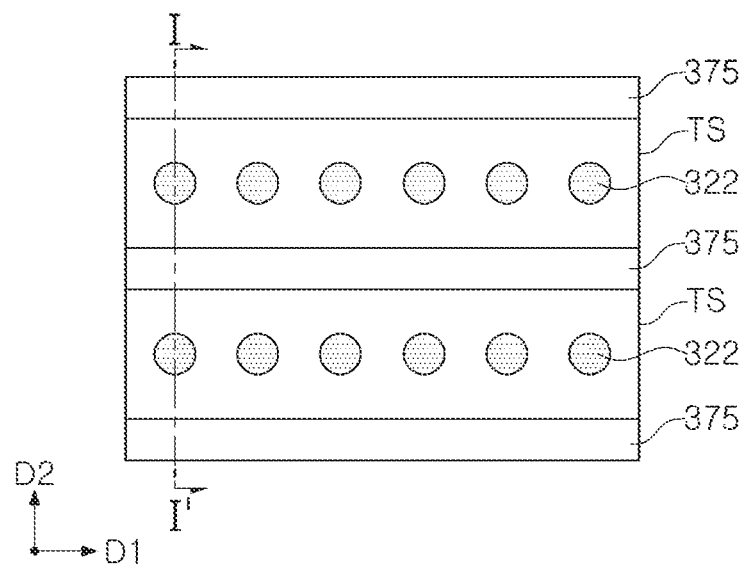
Figure 11B:
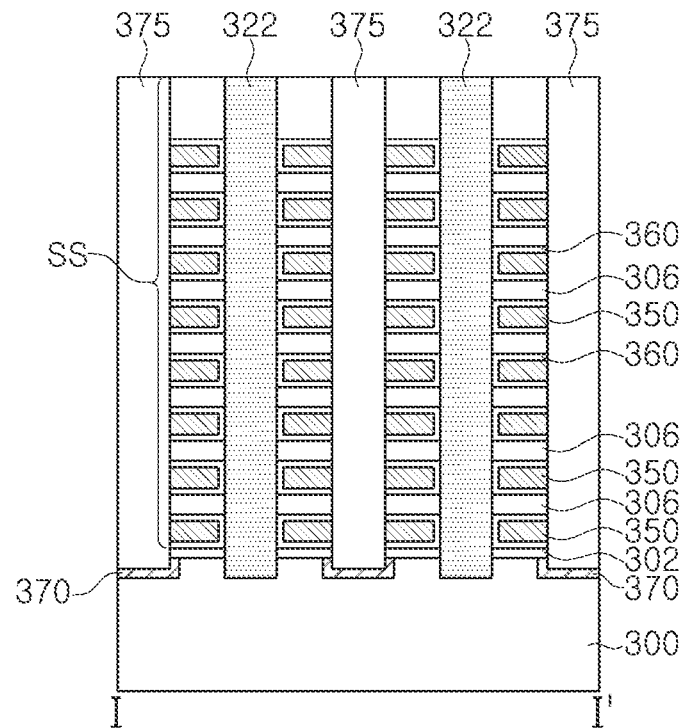

Referring to FIGS. 11A and 11B, after the recessed area R are formed, horizontal insulators 360 covering inner surfaces of the recessed areas R and gate electrodes 350 filling the remaining spaces of the recessed areas R may be formed. The horizontal insulators 360 and the gate electrodes 350 may form a horizontal insulating film and a conductive film, respectively, which sequentially cover the recessed areas R, and may be formed by locally forming the horizontal insulators 360 and the gate electrodes 350 in the recessed areas R by removing the horizontal insulating film and the conductive film in the trench T. The horizontal insulating film may be composed of one thin film or a plurality of thin films.

In some exemplary embodiments of the present disclosure, the horizontal insulating film may include a tunnel insulating film adjacent to the semiconductor pattern 322, a blocking insulating film adjacent to the gate electrodes 350, and a charge storage film therebetween. The conductive film may be formed to conformally cover the inner wall of the trench T while filling the recessed areas R. In this case, forming the gate electrodes 350 may include removing the conductive film in the trench T by a method of isotropic etching. The gate electrodes 350 and the insulating films 306 interposed therebetween may be defined as a stacked structure SS.

After the gate electrodes 350 are formed, a common source area 370 may be formed on the substrate 300. The common source area 370 may be formed by performing an ion injection process on the substrate 300 exposed by the trench T. The common source area 370 may have a conductivity type different to that of the semiconductor pattern 322.

Alternately, the area of the substrate 300 in contact with the semiconductor pattern 322 may have the same conductivity type as the semiconductor pattern 322. Each of the plurality of common source areas 370 may be connected to each other to be in an equipotential state. However, in other exemplary embodiments of the present disclosure, each of the plurality of common source areas 370 may be electrically separated so as to have different potentials.

An electrode separation pattern 375 charging the trench T may be formed on the common source area 370. For example, the electrode separation pattern 375 may include a silicon oxide film, a silicon nitride film, or a silicon oxynitride film.

Next, a desired three-dimensional semiconductor device may be manufactured by forming conductive pads connected to the semiconductor pattern 322, contact plugs, and bit lines connected to the contact plugs.

FIGS. 12 to 15 are perspective views illustrating a method of manufacturing a semiconductor device using a wet etching process according to exemplary embodiments of the present disclosure.

Figure 12:
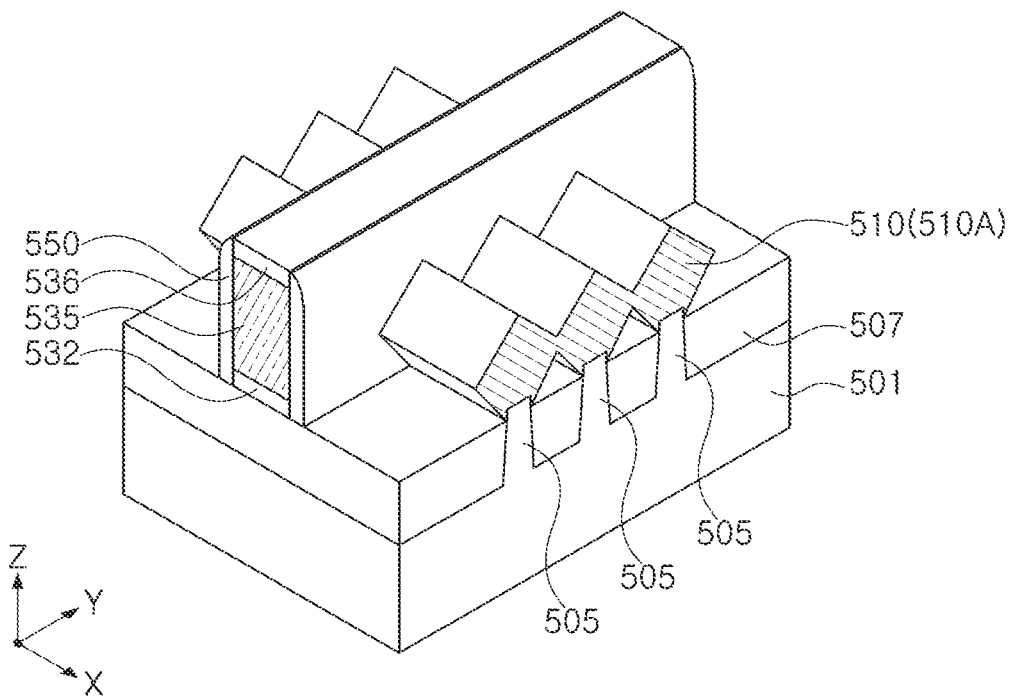
FIGS. 12 to 15 are perspective views illustrating a method of manufacturing a semiconductor device using a wet etching process according to exemplary embodiments of the present disclosure.

Referring to FIG. 12, active pins 505 are formed on a semiconductor substrate 501, and a source/drain area 510 comprising crystalline semiconductor areas 510A is formed on the active pin 505 exposed on both sides of the dummy gate electrode 535 formed above.

The crystalline semiconductor areas 510A may be formed by a selective epitaxial growth SEG process. The semiconductor areas 510A on the active pin 505 may be merged with each other during a growth process. The cross-sectional shape of the source/drain area 510 is not limited thereto, for example, the cross-sectional shape cut along the Y-Z plane of the source/drain area 510 may be shaped as a polygon such as a quadrangle, a hexagon, a circle, or an ellipse. The source/drain area 510 may have a higher level upper surface than that of the upper surface of the active pin 505. The source/drain area 510 may be formed of a semiconductor layer doped with an impurity. In some exemplary embodiments of the present disclosure, the source/drain area 510 may be composed of Si, SiGe, or SiC doped with impurities.

Figure 13:
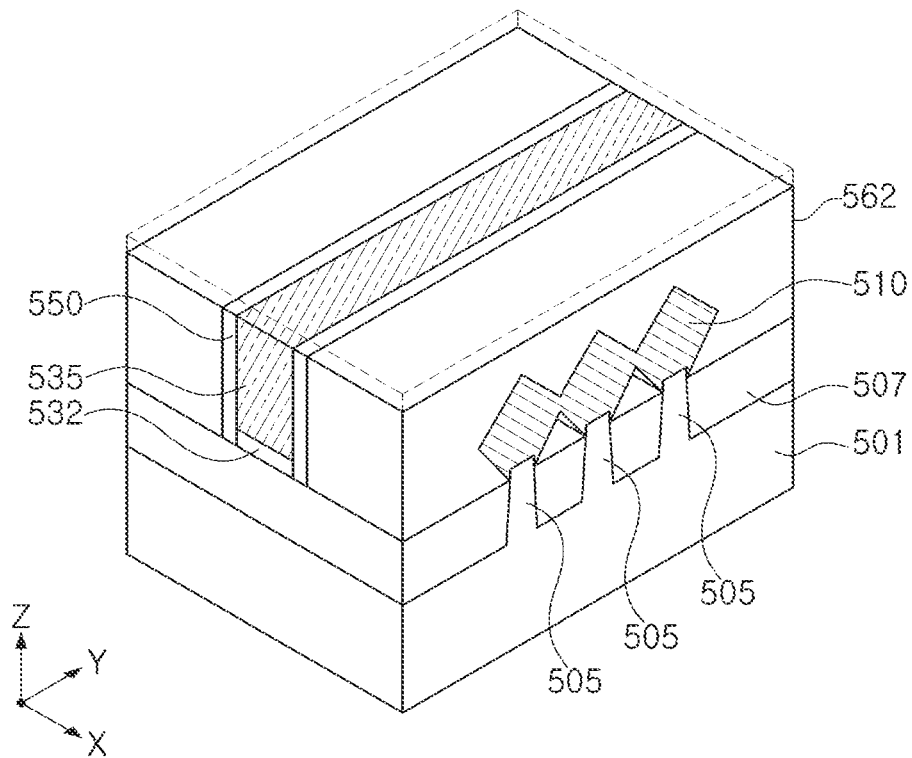

Referring to FIG. 13, an inter-gate insulating layer 562 may be formed on the source/drain area 510.

The inter-gate insulating layer 562 may cover the source/drain area 510, the dummy gate electrode 535 and an insulating spacer 550 to a sufficient thickness. The inter-gate insulating layer 562 may include, for example, an oxide, a nitride, and/or an oxynitride. Then, a partial portion (dotted line portion) of the inter-gate insulating layer 562 is planarized to expose the dummy gate electrode 535. The mask pattern layer 536 may be removed, and the upper surface of the dummy gate electrode 535 may be exposed in the present planarization process.

Figure 14:
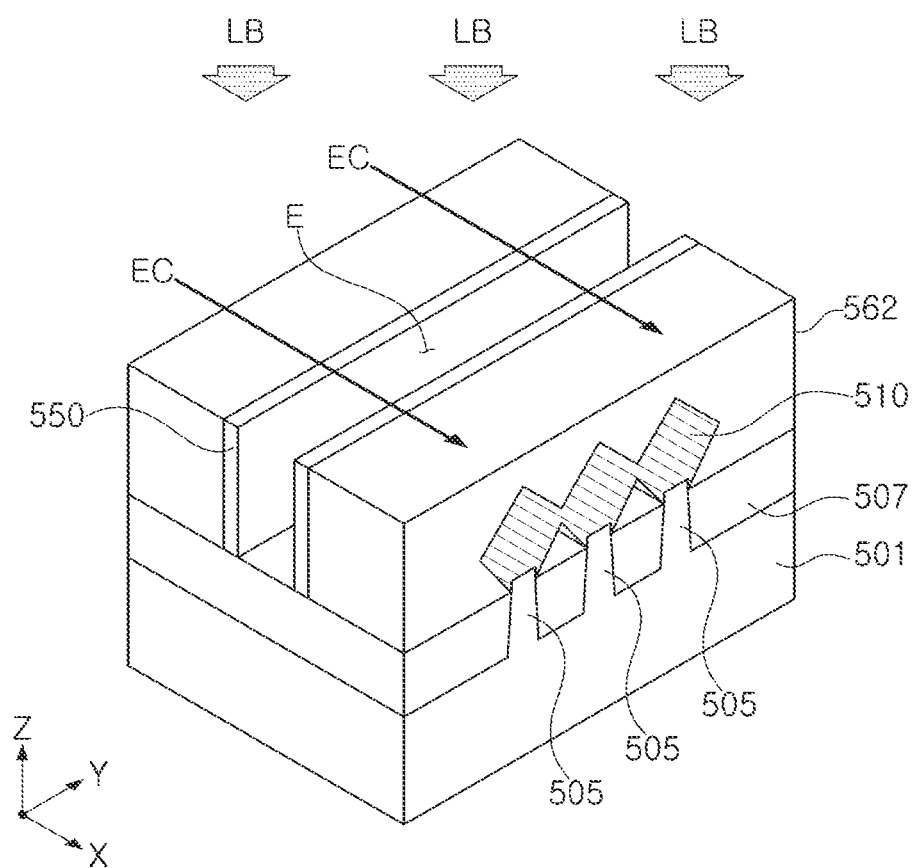

Referring to FIG. 14, the dummy gate insulating film 532 and the dummy gate electrode 535 may be removed to provide an open area E for forming a gate structure.

The dummy gate insulating film 532 and the dummy gate electrode 535 may be selectively removed with respect to a lower device separation layer 507 and the active pins 505 such that the open area E may expose the device separation layer 507 and the active pins 505. A removal process of the dummy gate insulating film 532 and the dummy gate electrode 535 may use a dry etching process and/or a wet etching process. In the peripheral circuit, the dummy gate insulating film 532 may remain to form a gate insulator.

In some exemplary embodiments of the present disclosure, the present etching process may be performed using the wet etching apparatus illustrated in FIGS. 1 to 5. For example, a wet etching apparatus 100 illustrated in FIG. 1 may be used. The wet etching apparatus 100 used in this example embodiment, as illustrated in FIG. 1, is located in the internal space 20S of the process bath 20, and the wafer W disposed thereon is exposed to an etchant flow EC, and the surface to be treated P1, which is in contact with the etchant flow, is directed upward, and therefore, the laser beam emitted from the laser unit 40 may be cast onto the surface to be treated P1 of the wafer W. Therefore, the device described herein used when the portion to be etched (e.g., dummy gate electrode 135) is exposed to the surface to be treated. Here, the etchant flow EC is illustrated as an x-direction, but may be another direction located in an x-y plane, for example, a y-direction.

Figure 15:
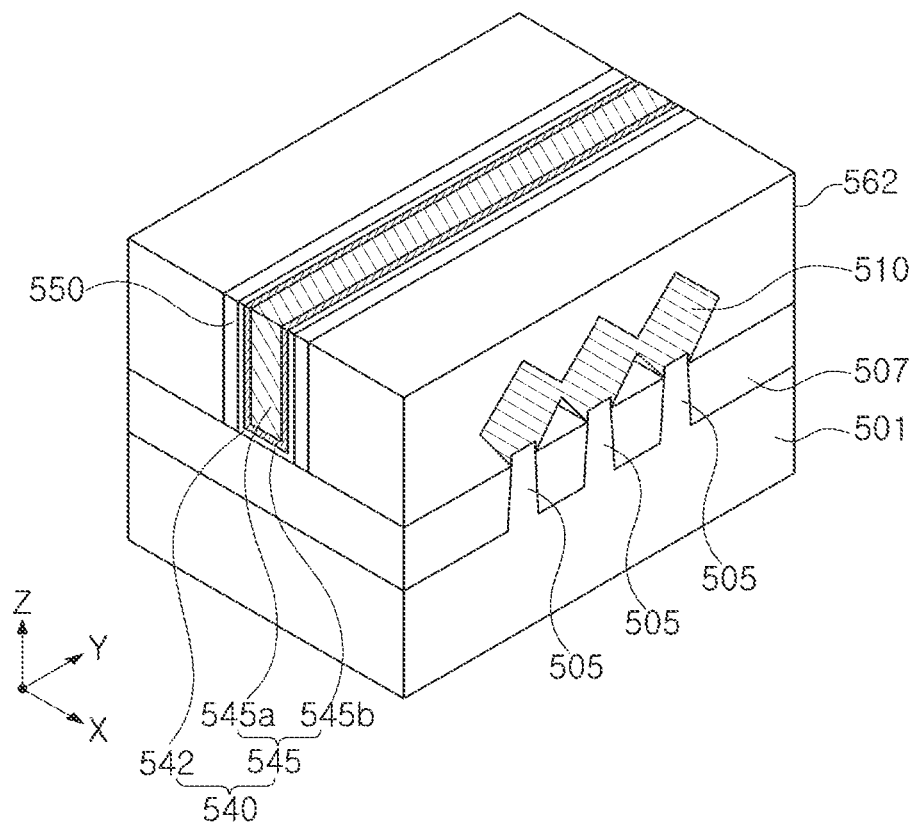

Referring to FIG. 15, a gate insulating film 542 and first and second gate electrodes 545a and 545b (the gate electrodes 545) may be formed in an open area E to form a gate structure 540.

The gate insulating film 542 may be formed substantially conformally along the sidewall and the lower surface of the open area E. The gate insulating film 542 may include an oxide, a nitride, or a high-k film. As used herein, "high-k" means having a dielectric constant that is higher than that of silicon dioxide. The first and second gate electrodes 545a and 545b may include a metal or a semiconductor material. Then, a desired semiconductor device may be manufactured by forming an inter-layer insulating layer and forming a contact plug which is connected to the source/drain area 510 while penetrating through the inter-layer insulating layer.

As set forth above, according to exemplary embodiments of the present disclosure, a uniform etching rate may be ensured in an entire area by uniformly heating a wafer using the laser unit disposed above the process bath. For example, a thick layer to be etched which requires a high processing temperature in various types of three-dimensional semiconductor devices may be effectively removed with a uniform etching rate.

The various features and aspects of the present invention are not limited to the above description, and can be more easily understood in the course of describing a specific embodiment of the present invention.

While exemplary embodiments of the present disclosure have been shown and described above, it will be apparent to those skilled in the art that modifications and variations could be made without departing from the scope of the present inventive concept.

What is claimed is:

1. A wet etching method, comprising:
preparing a process bath having:
an internal space having a support unit disposed therein,
a first sub-bath disposed on a first side of the process bath and having a first temporary accommodation space,
a second sub-bath disposed on the second side of the process bath, the second side opposed to the first side, and having a second temporary accommodation space,
a plurality of first connectors arranged on the first side of the process bath in a width direction of the process bath, and connecting the internal space to the first temporary accommodation space, and
a plurality of second connectors arranged on the second side of the process bath in the width direction of the process bath, and connecting the internal space to the second temporary accommodation space;
displacing a wafer on the support unit in the internal space of the process bath;
supplying an etchant to the first temporary accommodation space, and discharging the etchant directly into the internal space of the process bath through the first connectors;
flowing the etchant such that the wafer is contact with the etchant in the internal space of the process bath;
irradiating a laser beam having an area at least as large as an area of a top surface of the wafer onto an entirety of the top surface of the wafer, while the wafer is contact with the etchant;
receiving the etchant directly from the internal space of the process bath to the second temporary accommodation space through the second connectors such that the etchant flows freely within the internal space of the process bath from the plurality of first connectors to the plurality of second connectors; and circulating the etchant discharged from an outlet pipe connecting the second temporary accommodation space, using a circulation pipe connecting the inlet pipe and the outlet pipe and a circulation pump mounted on the circulation pipe.

2. The wet etching method of claim 1, further comprising detecting the concentration of an element to be etched discharged from the process bath, using a first concentration detecting unit connected to the outlet pipe or the circulation pipe, and supplying a pure etchant according to the concentration of the detected element to be etched.

3. The wet etching method of claim 2, further comprising detecting the concentration of the etchant discharged from the process bath, using a second concentration detecting unit connected to the outlet pipe or the circulation pipe, and supplying deionized water to the etchant according to the concentration of the detected etchant.

4. The wet etching method of claim 1, wherein the laser light source emits a line-type laser beam.

5. The wet etching method of claim 4, wherein the support unit is disposed in the internal space of the process bath and is configured to immerse the wafer in the etchant, and
wherein the process bath comprises a transparent window through which the line-type laser beam passes to the wafer disposed on the support unit.

6. The wet etching method of claim 4, wherein the top surface of the wafer faces upward, and is a surface to be treated of the wafer.

7. The wet etching method of claim 1, wherein the support unit comprises an opening disposed at an upper portion of the process bath and recessed into the internal space and a supporting part disposed around the opening and supporting an outer peripheral portion of the wafer.

8. The wet etching method of claim 7, wherein a surface to be treated of the wafer is directed to the internal space, and the laser beam irradiates the top surface of the wafer that is located opposite to the surface to be treated of the wafer.

9. The wet etching method of claim 7, wherein the wafer and the supporting part are brought into contact with each other such that the wafer closes the opening, while a surface to be treated of the wafer is in contact with the etchant.

10. The wet etching method of claim 1, wherein the etchant is supplied at a flow rate in a range of 0.1 to 1.0 m/sec.

11. A wet etching method, comprising:
preparing a process bath having:
an internal space including an opening and recessed into the internal space,
a supporting part disposed around the opening,
a laser unit disposed above the process bath and configured to cast a laser beam, through a transparent window,
a housing having a closed space in which the laser unit is disposed, the closed space being configured to be depressurized or maintained in a vacuum state,
a first sub-bath disposed on a first side of the process bath, and having a first temporary accommodation space,
a second sub-bath disposed on a second side of the process bath, and having a second temporary accommodation space, the second side of the process bath being the first side of the process bath,
a plurality of first connectors arranged on the first side of the process bath in a width direction of the process bath, and connecting the internal space to the first temporary accommodation space, and
a plurality of second connectors arranged on the second side of the process bath in the width direction of the process bath, and connecting the internal space to the second temporary accommodation space;
displacing a wafer on the support part in the internal space of the process bath;
supplying an etchant to the first temporary accommodation space, and discharging the etchant directly into the internal space of the process bath through the first connectors;
flowing the etchant such that a surface the wafer is treated with the etchant in the internal space of the process bath;
irradiating the laser beam of the laser unit onto a surface opposite to the treated surface of the wafer such that the wafer is heated, while the wafer is contact with the etchant;
receiving the etchant directly from the internal space of the process bath to the second temporary accommodation space through the second connectors such that the etchant flows freely within the internal space of the process bath from the plurality of first connectors to the plurality of second connectors; and
circulating the etchant discharged from an outlet pipe connecting the second temporary accommodation space, using a circulation pipe connecting the inlet pipe and the outlet pipe, and a circulation pump mounted on the circulation pipe,
wherein the laser beam is a cone beam having an area that is at least as large as the area of the wafer.

* * * * *